United States Patent
Joo

(10) Patent No.: US 6,762,970 B2
(45) Date of Patent: Jul. 13, 2004

(54) FLASH MEMORY DEVICE

(75) Inventor: Young Dong Joo, Ichon-Shi (KR)

(73) Assignee: Hynix Semiconductor Inc., Ichon-Shi (KR)

(*) Notice: Subject to any disclaimer, the term of this patent is extended or adjusted under 35 U.S.C. 154(b) by 57 days.

(21) Appl. No.: 10/286,973

(22) Filed: Nov. 4, 2002

(65) Prior Publication Data

US 2003/0117852 A1 Jun. 26, 2003

(30) Foreign Application Priority Data

Dec. 21, 2001 (KR) ........................................ 2001-82468

(51) Int. Cl.[7] .............................................. G11C 11/00
(52) U.S. Cl. ........................... 365/230.06; 365/230.01; 365/203; 365/204; 365/189.09
(58) Field of Search ........................ 365/230.06, 230.01, 365/203, 204, 189.09

(56) References Cited

U.S. PATENT DOCUMENTS 6,233,177 B1 * 5/2001 Shokouhi et al. ...... 365/185.23
6,249,458 B1 * 6/2001 Shokouhi et al. ...... 365/185.23
6,285,593 B1 * 9/2001 Wong .................... 365/185.23

FOREIGN PATENT DOCUMENTS

JP          02003203491 A  *  7/2003   ........... G11C/16/06

* cited by examiner

*Primary Examiner*—Viet Q. Nguyen
(74) *Attorney, Agent, or Firm*—Jacobson Holman PLLC

(57) ABSTRACT

The present invention relates to a flash memory device for read-out. The flash memory device comprises a pumping circuit for generating a pumping voltage higher than the power supply voltage depending on an enable signal generated when a standby mode, a read-out mode and a power supply voltage are set up, a capacitor for charging the potential depending on the pumping voltage of the pumping circuit, a word line decoder and a bit line decoder for decoding an address signal to select a word line and a bit line of a given cell from the flash memory cell array, and a word line driver and a bit line driver for applying a given voltage depending on an electric charge stored at the capacitor to the word line and the bit line of the selected cell in the flash memory cell array so that a read-out operation is performed. At this time, a voltage depending on the charge stored at the capacitor is applied to the word line driver and the bit line driver in the read-out mode. Therefore, lowering in the read-out speed by loading of the word line can be significantly improved.

5 Claims, 3 Drawing Sheets

FLASH MEMORY DEVICE

BACKGROUND OF THE INVENTION

1. Field of the Invention

The invention relates generally to a flash memory device. More particularly, the invention relates to a flash memory device capable of improving lowering in the read-out speed due to loading of a word line, in such as way that a pumping circuit is driven by a standby mode, a read-out mode, and an enable signal that is generated when the power supply voltage is set up, and a capacitor having a large capacitance is charged by an output voltage from the pumping circuit to apply a voltage depending on an electric charge stored at the capacitor in the read-out mode to a word line driver and a bit line driver.

2. Description of the Prior Art

In order to read out a given cell of the flash memory device, it is required that a voltage of more than a given amount be applied to a word line of the cell. In order to read out a cell of the flash memory device operating at the power supply voltage of 1.8 V that has been currently developed, it is required that a voltage of 4 V be applied.

Referring to FIG. 1, a construction of a flash memory device using a boosting circuit for reading out a conventional flash memory cell will be described.

A boosting circuit 11 is driven by an address transfer detection signal ATD and outputs a boosting voltage higher than the power supply voltage. A word line decoder 12 decodes an address signal to select a word line of a given cell from a flash memory cell array 16. A word line driver 13 applies the boosting voltage from the boosting circuit 11 to the word line of the cell selected by the decoding signal of the word line decoder 12. Meanwhile, the bit line driver 14 drives a given bit line of the flash memory cell array 16 depending on an external voltage. The bit line decoder 15 decodes the address signal to select a given bit line of the flash memory cell array 16.

In the conventional flash memory device constructed above, if the address signal add is shifted, the address transfer detection circuit detects the address signal add to output the address transfer detection signal ATD, as shown in FIG. 2. The boosting circuit 11 is then driven by the address transfer detection signal ATD to output the boosting voltage higher than the power supply voltage. Also, the boosting voltage is supplied to the word line of the cell that is selected through the word line driver 13. The word line is thus activated. As loading from the boosting circuit 11 to the word line is significantly large, however, it is required that the size of the pumping capacitor of the boosting circuit 11 be significantly large. Therefore, lots of time is consumed to boost the pumping capacitor up to a desired voltage. As such, as the word line is activated after a significant time delay since the address transfer detection signal ATD is outputted, there is a problem that the read-out speed is delayed.

SUMMARY OF THE INVENTION

The present invention is contrived to solve the above problems and an object of the present invention is to provide a flash memory device in which a word line is activated with no time delay, thus improving a read-out speed.

Another object of the present invention is to provide a flash memory device in which a word line is not boosted in a read-out mode and a boosting voltage is generated in a standby mode and a read-out mode, thus improving the read-out speed.

In order to accomplish the above object, a flash memory device according to the present invention, is characterized in that it comprises a pumping circuit for generating a pumping voltage higher than the power supply voltage depending on an enable signal generated when a standby mode, a read-out mode and a power supply voltage are set up, a capacitor for charging the potential depending on the pumping voltage of the pumping circuit, a word line decoder and a bit line decoder for decoding an address signal to select a word line and a bit line of a given cell from the flash memory cell array, and a word line driver and a bit line driver for applying a given voltage depending on an electric charge stored at the capacitor to the word line and the bit line of the selected cell in the flash memory cell array so that a read-out operation is performed.

Meanwhile, the pumping circuit comprises an oscillator driven by the enable signal, for outputting a signal of a period that is varied by the pumping voltage, a positive charge pump circuit for performing a pumping operation depending on the enable signal and the output signal of the oscillator to output the pumping voltage of a voltage higher than the power supply voltage, a dividing means for dividing the pumping voltage of the positive charge pump circuit, an edge trigger for sensing a rising edge of the output signal in the oscillator to output a signal delayed by a given time, a reference voltage generator for generating a reference voltage depending on the output signal of the edge trigger, a differential amplifier for comparing the reference voltage and the dividing voltage depending on the output signal of the edge trigger, and a switching means for charging an electric charge depending on the pumping voltage to the capacitor, depending on the output signal of the differential amplifier.

BRIEF DESCRIPTION OF THE DRAWINGS

The aforementioned aspects and other features of the present invention will be explained in the following description, taken in conjunction with the accompanying drawings, wherein.

DETAILED DESCRIPTION OF PREFERRED EMBODIMENTS

Figure 1:
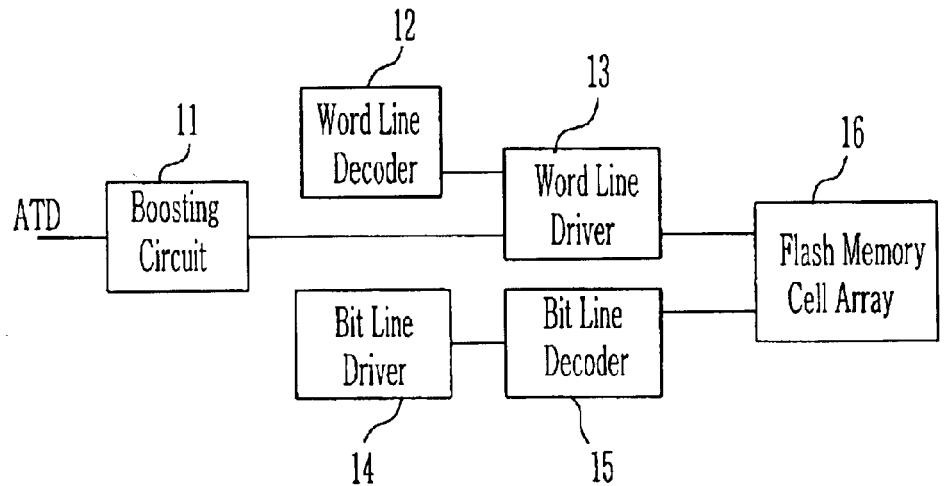
FIG. 1 is a block diagram of a flash memory device using a boosting circuit for reading out a conventional flash memory cell.
Figure 2:
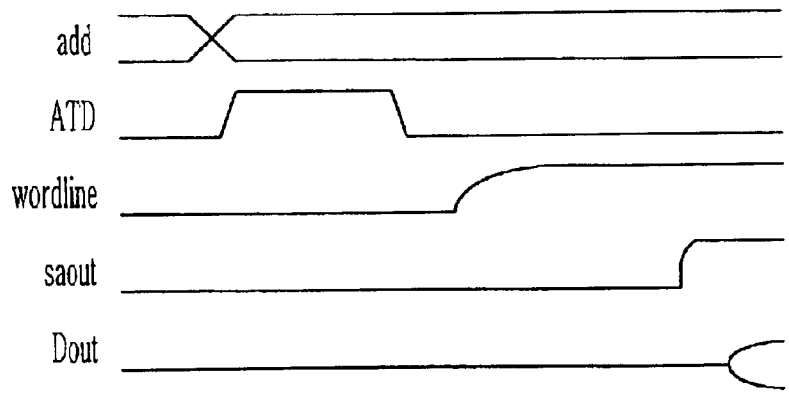
FIG. 2 shows an output waveform depending on a read-out operation of the conventional flash memory device.

The present invention will be described in detail by way of a preferred embodiment with reference to accompanying drawings, in which like reference numerals are used to identify the same or similar parts.

Figure 3:
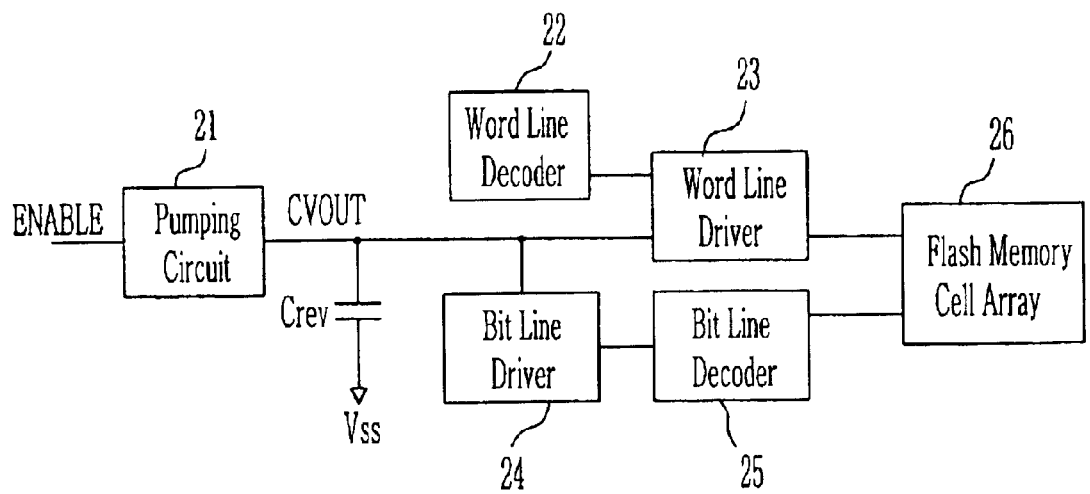
FIG. 3 is a block diagram of a flash memory device for reading out a flash memory cell according to the present invention.

FIG. 3 is a block diagram of a flash memory device for reading out a flash memory cell according to the present invention.

Referring now to FIG. 3, a construction of the flash memory device according to the present invention will be described.

A pumping circuit 21 outputs a given voltage depending on an enable signal ENABLE generated when a standby mode, a read-out mode and a power supply voltage Vcc are set up. A capacitor Crev charges an electric charge depending on an output voltage CVOUT of the pumping circuit 21 in the read-out mode and the standby mode to maintain the output voltage of the pumping circuit 21. At this time, the capacitor Crev has a large storage capability of over about 500 pF. It is therefore not required that the size of the pumping circuit 21 be large enough since the pumping circuit 21 is required to periodically charge only an electrical charge depending on the degree of leakage of the capacitor Crev. A word line decoder 22 decodes the address signal to select a word line of a given cell from the flash memory cell array 26. A word line driver 23 applies a given voltage CVOUT maintained by the capacitor Crev to the word line of the selected cell, depending on the decoding signal of the word line decoder 22. Meanwhile, a bit line driver 24 also drives a given bit line of the flash memory cell array 26 depending on the given voltage CVOUT that is maintained by the capacitor Crev. A bit line decoder 25 decodes the address signal to select a given bit line of the flash memory cell array 26.

Figure 4:
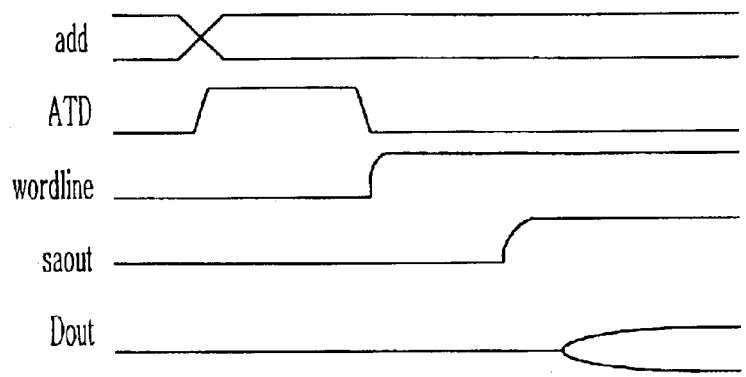
FIG. 4 shows an output waveform depending on a read-out operation of the flash memory device shown in FIG. 3.

In the flash memory device constructed above, as shown in FIG. 4, if the pumping circuit 21 is driven in a standby mode and a read-out mode to charge an electrical charge at the capacitor Crev and an address signal add is then shifted with a given voltage CVOUT maintained, the address transfer detection circuit detects it to output an address transfer detection signal ATD. If the word line decoder 22 decodes the address depending on the address transfer and then selects a cell to be read out, the word line driver 23 applies the given voltage CVOUT by the capacitor Crev to the word line of the selected cell. At this time, the bit line driver 24 is also driven depending on the given voltage CVOUT by the capacitor Crev. Thereby, the bit line driver 24 applies a given voltage to the bit line selected by the bit line decoder 25. Through this operation, it is possible to reduce the time that is taken when the word line is activated after the address transfer detection signal ATD is shifted. The read-output speed can thus be improved.

Figure 5:
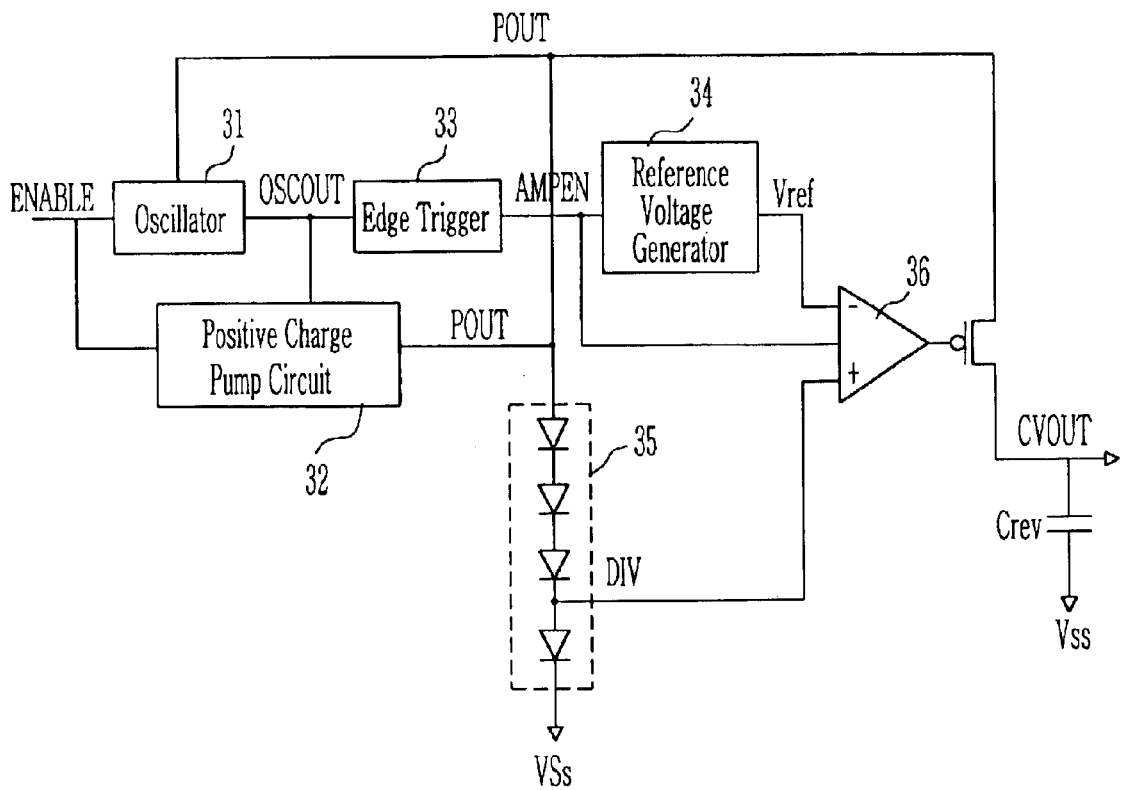
FIG. 5 shows a pumping circuit constituting the flash memory device according to the present invention.

FIG. 5 shows a pumping circuit of the flash memory device for read-out according to the present invention.

An oscillator 31 and a positive charge pump circuit 32 are driven by the enable signal ENABLE that is generated when the standby mode, the read-out mode and the power supply voltage Vcc are set up. The oscillator 31 is driven by the enable signal ENABLE. The oscillator 31 is a current control oscillator in which the period of an output signal OSCOUT is changed by a pumping voltage POUT from the positive charge pump circuit 32. The positive charge pump circuit 32 performs a pumping operation depending on the enable signal ENABLE and the output signal OSCOUT of the oscillator 31 to output a pumping voltage POUT. At this time, the pumping voltage POUT outputted from the positive charge pump circuit 32 is divided by the dividing means 35 having a plurality of diodes serially connected. An edge trigger 33 senses a rising edge of the output signal OSCOUT in the oscillator 31 and then delays the output signal OSCOUT by a given time to output an output signal AMPEN. A reference voltage generator 34 generates a reference voltage Vref depending on the output signal AMPEN of the edge trigger 33. A differential amplifier 36 compares the reference voltage Vref from the reference voltage generator 34 with a dividing voltage DIV from the dividing means 35 depending on the output signal AMPEN of the edge trigger 33 to output a comparison result. A PMOS transistor PM is driven by the output signal of the differential amplifier 36. The PMOS transistor PM charges the capacitor Crev using the pumping voltage POUT generated in the positive charge pump circuit 32 to make a voltage CVOUT of the node N a constant voltage.

A method of driving the pumping circuit constructed above will be explained by reference to FIG. 6.

Figure 6:
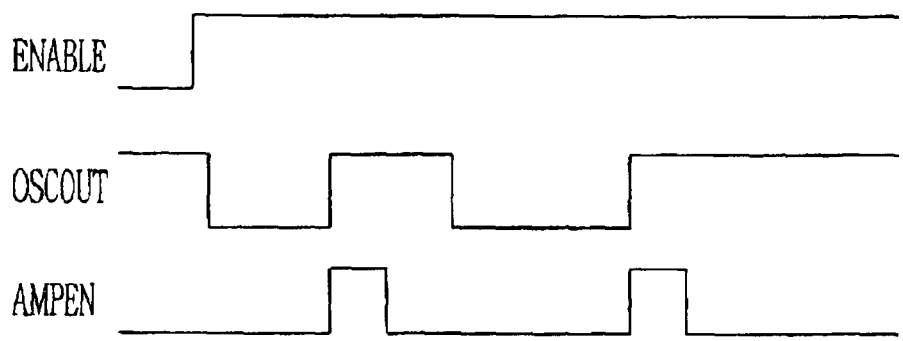
FIG. 6 shows an operation waveform of the pumping circuit according to the present invention.

FIG. 6 illustrates that after the enable signal ENABLE is shifted to a HIGH state, the output signal OSCOUT of the oscillator 31 and the output signal AMPEN of the edge trigger 33 are changed.

The enable signal ENABLE of a HIGH state that is generated when the standby mode, the read-out mode and the power supply voltage Vcc are set up is applied to the oscillator 31 and the positive charge pump circuit 32. At this time, the oscillator 31 outputs the output signal OSCOUT of a given width depending on the enable signal ENABLE. The period of the output signal OSCOUT is changed by the pumping voltage POUT outputted from the positive charge pump circuit 32. Also, the positive charge pump circuit 32 performs a pumping operation depending on the enable signal ENABLE and the output signal OSCOUT of the oscillator 31 to output the pumping voltage POUT. At this time, the pumping voltage POUT of the positive charge pump circuit 32 is divided by the dividing means 35 having a plurality of diodes serially connected. Meanwhile, the edge trigger 33 for receiving the output signal OSCOUT of the oscillator 31 senses a rising edge of the output signal OSCOUT in the oscillator 31 and then delays the output signal OSCOUT by a given time to output the output signal AMPEN. The reference voltage generator 34 outputs the reference voltage Vref of about 1 V depending on the output signal AMPEN of the edge trigger 33. The differential amplifier 36 compares the reference voltage Vref generated from the reference voltage generator 34 with the dividing voltage DIV by the dividing means 35. As a result of comparison, if the reference voltage Vref is higher than the dividing voltage DIV, for example, when the dividing voltage DIV is below 1 V, the differential amplifier 36 outputs a signal of a LOW state to turn on the PMOS transistor PM. Thereby, the capacitor Crev is charged by the pumping voltage POUT generated in the positive charge pump circuit 32 to make the voltage CVOUT of the node N a constant voltage. However, if the dividing voltage DIV is higher than the reference voltage Vref, the differential amplifier 36 outputs a signal of a HIGH state to turn off the PMOS transistor PM. Thereby, the differential amplifier 36 maintains the voltage of a voltage level charged in the capacitor Crev.

Figure 7:
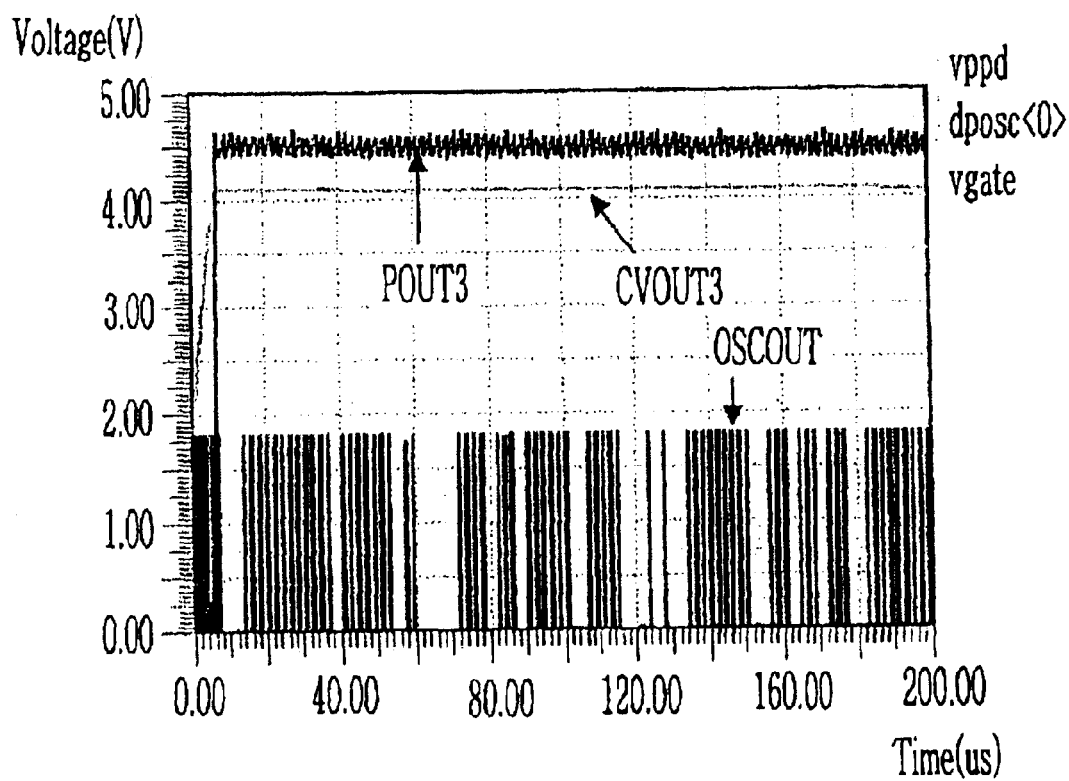
FIG. 7 is a graph showing a result that an output of the pumping circuit and a charge voltage of a capacitor according to the present invention are simulated.

FIG. 7 is a simulation result of the flash memory device for read-out according to the present invention. It can be seen that the pumping voltage POUT maintains about 4.5 V and the node CVOUT maintains the potential of 4 V by the charge charged in the capacitor Crev. These voltages are directly applied to the word line driver and the bit line driver upon the read-out mode.

As mentioned above, according to the present invention, the pumping circuit is driven by the enable signal generated when the standby mode, the read-out mode and the power supply voltage are set up and the capacitor having a large capacitance is charged using the output voltage, so that a voltage depending on the capacitor is applied to the word line driver and the bit line driver in the read-out mode. Therefore, the present invention has an acting effect that it can significantly improve lowering in the read-output speed due to loading of a word line. Further, the present invention has an advantage that it can significantly reduce the area without a boosting pump circuit occupying a large area and also reduce the power consumption by the edge trigger included in the charge pump circuit.

The present invention has been described with reference to a particular embodiment in connection with a particular application. Those having ordinary skill in the art and access to the teachings of the present invention will recognize additional modifications and applications within the scope thereof.

It is therefore intended by the appended claims to cover any and all such applications, modifications, and embodiments within the scope of the present invention.

What is claimed is:

1. A flash memory device, comprising:
   a pumping circuit for generating a pumping voltage higher than the power supply voltage depending on an enable signal;
   a capacitor for charging the potential depending on the pumping voltage of the pumping circuit;
   a word line decoder and a bit line decoder for decoding an address signal to select a word line and a bit line of a given cell in the flash memory cell array; and
   a word line driver and a bit line driver for applying a given voltage depending on an electric charge stored at the capacitor to the word line and the bit line of the selected cell in the flash memory cell array, so that a read-out operation is performed.

2. The flash memory device as claimed in claim 1, wherein the enable signal is a signal generated when the standby mode, the read-out mode and the power supply voltage are set up.

3. The flash memory device as claimed in claim 1, wherein the pumping circuit comprises:
   an oscillator driven by the enable signal, for outputting a signal of a period that is varied by the pumping voltage;
   a positive charge pump circuit for performing a pumping operation depending on the enable signal and the output signal of the oscillator to output the pumping voltage of a voltage higher than the power supply voltage;
   a dividing means for dividing the pumping voltage of the positive charge pump circuit;
   an edge trigger for sensing a rising edge of the output signal in the oscillator to output a signal delayed by a given time;
   a reference voltage generator for generating a reference voltage depending on the output signal of the edge trigger;
   a differential amplifier for comparing the reference voltage and the dividing voltage depending on the output signal of the edge trigger; and
   a switching means for charging an electric charge depending on the pumping voltage to the capacitor, depending on the output signal of the differential amplifier.

4. The flash memory device as claimed in claim 3, wherein the differential amplifier outputs a signal of a LOW state when the reference voltage is higher than the dividing voltage and outputs a signal of a HIGH state when the reference voltage is lower than the dividing voltage.

5. The flash memory device as claimed in claim 3, wherein the switching means is a PMOS transistor.

* * * * *